United States Patent [19]

Hubbard, Jr.

[11] Patent Number: 4,626,730
[45] Date of Patent: * Dec. 2, 1986

[54] METHOD AND APPARATUS FOR ACTIVE CONTROL OF VIBRATIONS

[75] Inventor: James E. Hubbard, Jr., Cambridge, Mass.

[73] Assignee: Massachusetts Institute of Technology, Cambridge, Mass.

[*] Notice: The portion of the term of this patent subsequent to Jan. 21, 2003 has been disclaimed.

[21] Appl. No.: 779,528

[22] Filed: Sep. 24, 1985

Related U.S. Application Data

[63] Continuation of Ser. No. 640,759, Aug. 14, 1984, Pat. No. 4,565,940.

[51] Int. Cl.$^4$ .................................... H01L 41/08
[52] U.S. Cl. .................... 310/326; 310/800; 310/316; 310/317
[58] Field of Search .............. 310/800, 326, 327, 316, 310/317

[56] References Cited

U.S. PATENT DOCUMENTS 4,366,768  1/1983  Kulischenko et al. .......... 114/144 E
4,398,173  4/1983  Kulischenko et al. ........... 340/52 R

OTHER PUBLICATIONS

Shuford, Richard J. et al., Piezoelectric Polymer Films for Application in Monitoring Devices, Army Materials and Mechanics Research Center, (Feb. 1977), (AMMRC TR77-2).
Greaves, Richard and George Sawyer, Piezoelectric Transducers for Vibration and Pressure Monitoring, Phys. Technol., 14:15–18 (1983).
Edelman, Seymour, Piezoelectric Polymers and Their Applications, National Bureau of Standards, Washington, D.C.
Bailey, Thomas and James E. Hubbard, Active Vibration Control of a Cantilever Beam, Submitted for presentation at Vibration Damping Workship, Long Beach, CA, Feb. 27–29, 1984.
McElheny, Robert K., Active Control of Vibrations in a Cantilever Beam Using $PVF_2$ Film, Submitted in Jun. 1983 to the Department of Mechanical Engineering in partial fulfillment of the requirement of the Degree of Bachelor of Science, Catalog date Sep. 28, 1983.

Primary Examiner—MArk O. Budd
Attorney, Agent, or Firm—Hamilton, Brook, Smith & Reynolds

[57] ABSTRACT

A method and apparatus is disclosed in which a piezoelectric film is used to control or dampen vibrations in a mechanical system. Voltage of proper amplitude and phase is fed across the piezoelectric film to induce strain in the film of appropriate phase, amplitude and frequency to dampen beam vibrations of the mechanical system. The film may be applied directly to the mechanical system or an intermediate viscoelastic layer may be provided. Various control functions are described for determining the correct voltage to be applied to the film.

18 Claims, 10 Drawing Figures

Logarithmic plot of tip displacement decay.

METHOD AND APPARATUS FOR ACTIVE CONTROL OF VIBRATIONS

This application is a continuation of application Ser. No. 640,759, filed 8/14/84, now U.S. Pat. No. 4,565,940.

TECHNICAL FIELD

This invention is in the field of structural control and more particularly relates to the control of vibrations in mechanical systems.

BACKGROUND ART

Certain ceramic materials and inorganic crystals, such as quartz and barium titanate, have been known to exhibit piezoelectric characteristics. Piezoelectric materials transform a mechanical force to an electrical response and, conversely, transform an electrical signal to a mechanical motion. If alternating compressive and tensile stress is applied, opposite electrical charges are produced on opposing faces. When an electrical charge or potential difference is applied to piezoelectric material, it undergoes changes in thickness and thus produces mechanical forces. If alternating voltage is applied, periodic variations in thickness are produced. Conventional piezoelectric materials are hard, stiff, brittle, dense, and difficult to process. They are used in devices such as loudspeakers and clocks.

Recently, certain organic polymers, such as polyvinylidene fluoride ($PVF_2$), polyvinyl fluoride and polyvinyl chloride have been shown to exhibit piezoelectric properties. Such polymers can be processed into films which are flexible and lightweight. $PVF_2$ is a semi-crystalline high molecular weight polymer whose basic building block is ($CH_2$—$CF_2$). When properly treated by orientation and polarization, $PVF_2$ films have high piezo- and pyroelectric activities.

After polarization, a piezoelectric film has a positive side and a negative side. When positive voltage is applied to the positive side of the film, it causes the film to elongate. Conversely, negative voltage applied to the positive side causes the film to shrink. Alternating voltage causes oscillations of the film which are too small to be visually detected. Larger strains can be produced through the use of a bimorph, which consists of two piezoelectric films glued together along their positively charged sides. Voltage applied to the bimorph will cause the top film to elongate and the bottom film to shrink. Such movement can be seen by the naked eye if an alternating voltage is applied at appropriate frequencies.

Very thin films (down to a few microns) can be made from the $PVF_2$. To date, $PVF_2$ films have found numerous commercial uses. These include use in sensing devices, microphones, audio component membranes, underwater sounding detectors, medical diagnostic equipment, pressure sensitive elements in contactless switches and manual keyboards and nondestructive materials testing methods.

A necessary consideration in designing a mechanical system is the control of vibrations, which occur in all moving mechanical systems. If left undamped, vibrations can cause large dynamic stresses which in turn lead to fatigue failure. Fatigue failure not only reduces the useful life of the mechanical system, but also may cause breakdown or failure to occur at a critical point in its operation. Additionally, in some robotic applications, the response time can be considerably improved if vibrations can be damped more quickly.

One technique which has been used in efforts to damp or check vibrations is the application of a viscoelastic material applied to a vibrating surface. A viscoelastic material is one which is viscous but which also exhibits certain elastic properties such as the ability to store energy of deformation. In such a material, the application of a stress gives rise to a strain that approaches its equilibrium value slowly. In a modification of this technique, a stiff foil is placed on top of the viscoelastic material, thus creating a constrained viscoelastic damper. This stiff constraining layer causes a large shear to occur in the viscoelastic material. As a result, more energy is dissipated per cycle of vibration and damping of the vibration occurs more rapidly than would be the case without the constraining layer. Such a viscoelastic layer with a constraining foil is manufactured in tape form. Presently, this configuration is used as a noise-control measure for aircraft fuselages and in damping the sway of skyscrapers.

The design of the constrained layer damper is determined by the desired application, the frequency of resonance of vibration, temperature requirements and weight and size considerations. If materials are carefully selected, they will provide a good damping effect for a wide range of applications. Weight considerations are often important in material selection and ideally, a damper will provide the required damping with a minimum of added weight.

Vibration control is often critical in aircraft, robotics, and satellites. In space, the need for vibration control is especially problematic because there is no natural damping effect other than the inernal damping present in the structure itself. This problem may be compounded by the fact that some satellites have flexible long arms with a low natural frequency and thrusters at points. Control of such a flexible beam is difficult. A damping device able to act at many points along a flexible beam is desirable in this context and for many other control applications.

The applicability of a constrained viscoelastic damper in such a context has been investigated. For example, a constrained layer damper has been built into beams of various designs. Inserts of the viscoelastic damping material are placed in the beam. A large amount of shear is created in the inserts as the beam vibrates. Localized application of damping tapes to the surface is another approach which has been tested as a means of providing damping along a flexible beam. In addition to allowing damping along such a beam, viscoelastic inserts and localized application of damping tapes reduce vibrations with a smaller weight increase than would occur if the entire surface of a vibrating part were covered.

Application to less than the entire surface requires a full understanding of the vibration modes if localized damping is to be effective in relation to all frequencies of vibration and thus in providing adequate vibration reduction. In addition, the damping capabilities of a constrained layer have been shown to be adversely affected by dissipative heating.

DISCLOSURE OF THE INVENTION

This invention pertains to the use of a piezoelectric film to control or dampen vibrations in a mechanical system.

Piezoelectric film can be used as a constraining layer in a constrained viscoelastic layer damper. Alternatively, damping can be accomplished using a layer of the film applied directly to the member in which damping is to occur (hereinafter called a free damping layer). Application of a voltage to the piezoelectric film of appropriate phase, amplitude and frequency induces damping of vibrations. Damping occurs because the piezoelectric properties of the damping film convert the applied voltage into a mechanical movement of the correct phase, frequency and amplitude to reduce the vibrations. If the film is used as a constraining layer applied to the surface of a viscoelastic layer, application of voltage across the film can cause the film to elongate, causing a greater shear in the viscoelastic layer and thus greater damping. Larger shears are produced in the viscoelastic layer if the piezoelectric film is used as a constraining layer than would be produced if the stiff-foil type of constrained layer damper is used. If the piezoelectric film is used without the viscoelastic material, damping will be caused as a result of the direct effect of the conversion of electrical voltage into mechanical movement. The film will actually pull on the vibrating beam, thus dissipating energy and causing greater damping.

The use of piezoelectric film as an active means of damping vibrations in a mechanical system has significant advantages over the use of passive damping methods of the prior art.

Added weight is minimized when the film is used. Because the film is thin and lightweight, this is true even when the film is applied to the entire surface of the device where vibrations are to be controlled. In addition, the film is flexible and easily shaped or cut to conform closely to the surface contours.

Perhaps most significantly, however, the damping effect induced by a piezoelectric film can be controlled by monitoring and controlling the film correctly in a feedback loop. That is, by varying the voltage applied to the film, it is possible to provide the degree of damping appropriate for a given system. In this way, more effective damping of vibrations than is possible with conventional methods can be achieved.

The piezoelectric film is a distributed parameter structure in the sense that it is an extended flexible structure theoretically capable of damping an infinite number of vibrational modes. This is in contrast to spatially discrete structures currently used for sensing and damping vibrations (such as quartz crystals) which can control or damp only a limited or finite number of vibrational modes and as such are not as effective in responding to or controlling the damping of distributed parameter systems.

BRIEF DESCRIPTION OF THE DRAWINGS

FIG. 7a is an alternate embodiment of the apparatus of FIG. 7 in which a bimorph film is utilized in place of the single piezoelectric film 14 of FIG. 7.

BEST MODE FOR CARRYING OUT THE INVENTION

The preferred embodiments of this invention can be further described with reference to the Figures.

Figure 1:
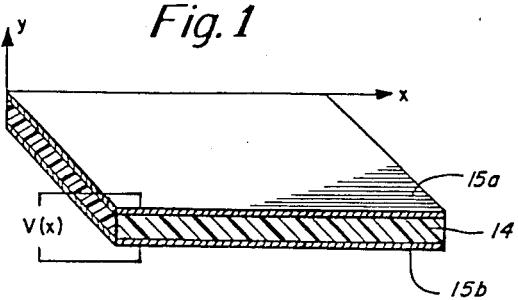
FIG. 1 is a schematic representation of a polyvinyl fluoride piezoelectric film used in the embodiments of the invention.

The active damping element utilized in accordance with the invention is a piezoelectric polymer, poly(vinylidene fluoride) film $PVF_2$. $PVF_2$ is a polymer that can be polarized or made piezoelectrically active with the appropriate processing during manufacture. In its non-polarized form, $PVF_2$ is essentially a tough, flexible piezoelectric crystal. Polarized $PVF_2$ is commercially available as a thin polymeric film from the Pennwalt Corp., King of Prussia, Pa. As shown in FIG. 1, the film 14 generally has layers 15a and 15b of nickel or aluminum deposited on each face to provide electrical contact surfaces to conduct a voltage or field across its faces.

For uniaxially polarized $PVF_2$, a voltage or field applied across its faces (y-direction) results in a longitudinal (x-direction) strain. Biaxially polarized $PVF_2$ would provide strain in both the x- and z-directions. The strain occurs over the entire area of the $PVF_2$ making it a distributed-parameter damping actuator.

Figure 2:
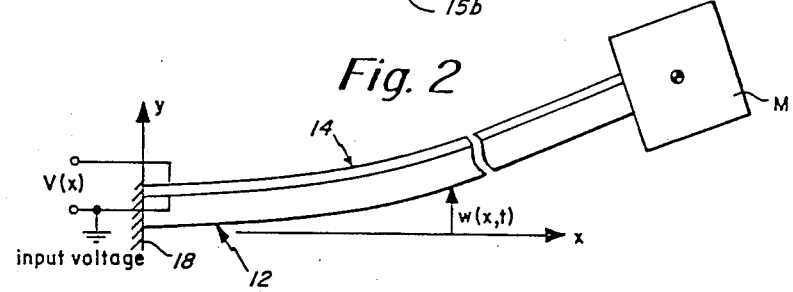
FIG. 2 is a schematic representation of an application of a free damping layer embodiment of the invention, as applied to a cantilevered beam.

In order to verify the principles of the invention, a simple damper configuration was implemented, as shown in FIG. 2, in which a thin layer of $PVF_2$ was bonded to one side of a steel cantilevered beam 12. (Note: For simplicity, the nickel/aluminum contact layers 15a and 15b have been left out of this figure and further drawings but it is understood that some such conductive layer may be required.) Beam 12 is affixed at one end to support 18 and the beam 12 and film 14 permitted to vibrate. Transverse vibrations of the beam, $w(x,t)$ are analyzed below. A subscript $(.)_1$ refers to the original cantilevered beam 12 while a subscript $(.)_2$ refers to the $PVF_2$ layer 14.

Figure 3:
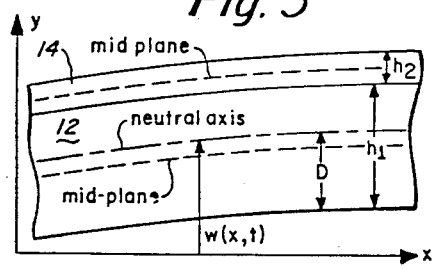
FIG. 3 is a detailed section of the embodiment of FIG. 2 showing the coordinates used in deriving the control algorithms for damping the beam of FIG. 2.

The effect of a voltage applied to the $PVF_2$ is to introduce a strain, $e_p$ in the $PVF_2$ layer 14 given by Equation 1.

$$e_p(x) = V(x) \cdot \frac{d_{31}}{h_2} \tag{1}$$

where V is the applied voltage, $d_{31}$ is the appropriate static piezoelectric constant, and $h_2$ is the thickness (y-direction) of the PVF$_2$ layer. (See FIG. 3 which shows the details of the beam and layer under strain.) This strain $e_p$ gives rise to two kinds of motion in the beam. One is a longitudinal strain, $e_p$, to keep a force equilibrium in the axial (x) direction. The steady state value of $e_1$ is found by solving the force equilibrium and is given by Equation 2.

$$e_1(x) = \frac{E_2 h_2}{E_1 h_1 + E_2 h_2} \cdot e_p(x) \tag{2}$$

where E is the modulus of elasticity and h is the thickness of the layers. The result of these strains is a net force in each beam layer due to the applied voltage. The net force in each layer acts through the moment arm from the mid-plane of the layer to the neutral axis of the beam, producing a torque given by Equation 3.

$$T(x) = E_1 h_1 b e_1 \left( \frac{h_1}{2} - D \right) + E_2 h_2 b (e_p + e_1) \left( \frac{h_2}{2} + h_1 - D \right) \tag{3}$$

where b is the width of the beam (assumed that $b_1 = b_2$) and D is the location of the neutral axis of the composite beam and is given by Equation 4.

$$D = \frac{E_1 h_1^2 + E_2 h_2^2 + 2 h_1 h_2 E_2}{2(E_1 h_1 + E_2 h_2)} \tag{4}$$

Combining Equations 1-4 and reducing yields:

$$T(x) = V(x) \cdot d_{31} \left( \frac{h_1 + h_2}{2} \right) \frac{E_1 h_1 E_2 b}{(E_1 h_1 + E_2 h_2)} \tag{5}$$
$$= V(x) \cdot c$$

where c is a constant for a given beam material and geometry. Assuming that the longitudinal strain, $e_1$, settles much faster than the applied voltage is changing then $$T(x,t) = V(x,t) \cdot c \tag{6}$$

Combining Equation 6 with a conventional Bernoulli-Euler beam analysis yields the equations of motion for transverse vibrations, $w(x,t)$, of the composite beam. The governing equation is $$\frac{\partial^2}{\partial x^2} \left( E1 \frac{\partial^2 w}{\partial x^2} - c \cdot V(x,t) \right) + pA \frac{\partial^2 w}{\partial t^2} = 0 \text{ for } 0 < x < L \tag{7}$$

with boundary conditions $$w = \frac{\partial w}{\partial x} = 0 \text{ for } x = 0$$

$$\left. \begin{array}{l} E1 \dfrac{\partial^2 w}{\partial x^2} = -I_t \dfrac{\partial^3 w}{\partial t^2 \partial x} + c \cdot V(x,t) \\ E1 \dfrac{\partial^3 w}{\partial x^3} = M_t \dfrac{\partial^2 w}{\partial t^2} + c \cdot \dfrac{\partial V(x,t)}{\partial x} \end{array} \right\} \text{ for } x = L \tag{8}$$

where $E1 = E_1 I_1 + E_2 I_2$. in which I is the area moment of inertia of the layer about the z-axis, $pA = p_1 A_1 + p_2 A_2$, p is the density of the layer, A is the cross-sectional area of the layer and $M_t$ and $I_t$ are the tip mass and tip inertia, respectively.

Assuming that the damping film has a uniform geometry and a spatially uniform voltage is applied along its length, the spatial derivatives for the input voltage may be deleted from the system Equations 7 and 8 leaving $$EI \frac{\partial^4 w}{\partial x^4} + pA \frac{\partial^2 w}{\partial t^2} = 0 \text{ for } 0 < x < L \tag{9}$$

with boundary conditions $$w = \frac{\partial w}{\partial x} = 0 \text{ for } x = 0$$

$$\left. \begin{array}{l} EI \dfrac{\partial^2 w}{\partial x^2} = -I_t \dfrac{\partial^3 w}{\partial t^2 \partial x} + c \cdot V(t) \\ EI \dfrac{\partial^3 w}{\partial x^3} = M_t \dfrac{\partial^2 w}{\partial t^2} \end{array} \right\} \text{ for } x = L \tag{10}$$

Note that the control voltage only appears in one of the boundary conditions. Equations 9 and 10 describe a linear distributed-parameter system that only has boundary control. With a distributed-parameter actuator, one is able to provide control in the equations of motion without nonlinear terms (e.g., spatial delta functions).

Using distributed-parameter control theory a control algorithm for an active free layer damper for the system of Equations 9 and 10 which can be derived which allows one the possibility of controlling all the modes of vibration at once, provided that the system is controllable through the damper.

The control problem is to damp the vibrations of the system described in Equations 9 and 10 using the input voltage to the PVF$_2$, V(t), as the control variable. Assume a practical limit on the magnitude of V(t), i.e., $$|V(t)| \leq V_{max} \tag{11}$$

For the moment, also assume there is no restriction on the type of sensors available.

Lyapunov's second or direct method for distributed-parameter systems is a straightforward design method that can deal with bounded inputs [Buhler, E. and Franke D., "Topics in Identification and Distributed Parameter Systems", *Advances in Control Systems and Signal Processing*, Vol. 1, Friedr. Vieweg & Sohn, Wiesbaden, Germany, 1980; Kalmann, R. E. and Bartram, J. E., "Control Systems Analysis and Design Via the 'Second' Method of Lyapunov", *ASME J. of Basic Eng.*, pp 371-400, 1960]. With this method, one defines a functional that may resemble the energy of the system and chooses the control to minimize the time rate of change of the functional at every point in time. An appropriate functional for the system described by Equations 9 and 10 is the sum of the squares of the displacement and velocity, integrated along the length of the beam. Applying this technique yields Equation 12.

$$V = -\text{sgn}\left( \left. \frac{\partial^2 w}{\partial t \partial x} \right|_L \right) \cdot V_{max} \text{ where } \left. \frac{\partial^2 w}{\partial t \partial x} \right|_L \tag{12}$$

is the angular velocity at the tip of the beam. This means that the control voltage should be chosen with as large a magnitude as possible and should generate a torque (c.V) that opposes the angular motion of the tip of the beam.

This control law has several desirable characteristics. First, no modes have been neglected. This control law will theoretically work with any and all modes of vibration of a cantilevered beam since every mode has some angular motion at the tip of the beam. Secondly, the control law depends only on the angular velocity at the tip of the beam, not on an integral along its length. This is a feature of Lyapunov's second method when applied to systems that only have boundary control and makes it possible to implement a distributed-parameter control law with a discrete sensor.

There are also several disadvantages with this control law. The sgn(.) function is nonlinear and discontinuous when its arguement is zero. This nonlinear control law could lead to problems such as limit-cycling and/or sliding modes. Also, in practice, the angular velocity of the tip is not readily available. However, an accelerometer at the tip of the beam can be used to measure the linear acceleration which can be integrated to find the linear velocity of the tip. For any given mode of vibration, the linear velocity is directly proportional to the angular velocity, although this relation does not hold if more than one mode of vibration is present.

It was therefore decided to test the damper on only one mode of vibration. The first mode was chosen because it was the easiest to isolate.

Two other control algorithms were compared against the Lyapunov control law in the preliminary testing of the damper. Written in terms of the linear velocity at the tip of beam, the three are 1. Lyapunov:

$$V(t) = -\text{sgn}\left(\left.\frac{\partial w}{\partial t}\right|_L\right) \cdot V_{max}$$

2. Constant-gain negative velocity feedback:

$$V(t) = -k \cdot \left(\left.\frac{\partial w}{\partial t}\right|_L\right) \; ; \; |V(t)| \leq V_{max}$$

3. Constant-amplitude negative velocity feedback:

$$V(t) = -k(t) \cdot \left(\left.\frac{\partial w}{\partial t}\right|_L\right) \; ; \; |V(t)| \leq V_{max}$$

where k is a feedback gain constant.

As mentioned previously, the Lyapunov controller function is nonlinear and discontinuous. The constant-gain controller function can be derived from physical insight (negative velocity feedback tends to stabilize the system) or more rigorously from a modal control viewpoint. The constant-gain controller function is linear and continuous, but as the velocity amplitude decays, so does the feedback voltage amplitude. This reduces the effectiveness of the damper at low vibration levels, for a given voltage limit. The constant-amplitude controller compensates for the decaying velocity amplitude by adjusting the feedback gain, k(t), to keep the amplitude of the feedback voltage constant. This controller is continuous but nonlinear, and may be less effective (approximately 20%) than the Lyapunov controller since a square wave has more area than a sine wave if they have equal amplitude. However, the constant-amplitude controller may be easier to implement since the control circuitry does not have to produce high voltage step changes.

Figure 4A:
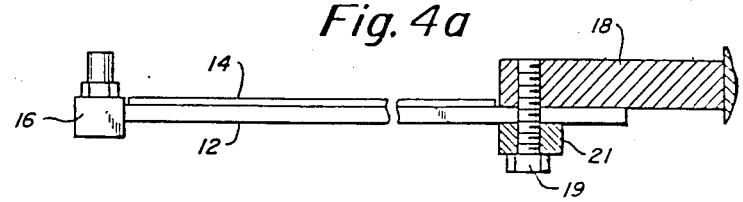
FIGS. 4a and 4b show the top view and side view, respectively, of the experimental beam and fixture utilized in an embodiment of the invention.
Figure 4B:
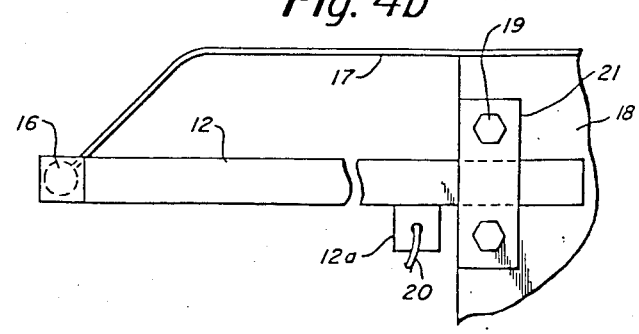

The dimensions and physical properties for a test model are given in Table 1. A schematic diagram sketch of the beam and clamping fixture is shown in FIGS. 4a and 4b. Included as part of the tip mass of beam 12 is a 2 gm accelerometer 16 to monitor the vibrations of the tip of the beam. The leads 17 to the accelerometer were made from a pair of small wires shielded inside a layer of aluminum foil and were extended above the beam from the clamping fixture 18 to the accelerometer at the tip. This configuration provided the best shielding and had the least effect on the vibration of the beam. Clamping fixture 18 secures the beam 12 to mechanical ground by bolts 19 which extend through clamping block 21.

The PVF$_2$ film 14 is uniaxially polarized. Table 2 gives the dimensions and some physical properties of the film 14. The PVF$_2$ film 14 is bonded to the steel beam using Eccobond 45LV, a low viscosity two-part epoxy. The average adhesive thickness is about 10 μm. The leads to the PVF$_2$ film 14 consist of wires 20 soldered to tabs 12a of copper foil. The copper tabs 12a are clamped against the nickel plating on the appropriate face of the PVF$_2$ film 14.

Impact testing is first used to identify the natural frequencies and modal damping of an uncontrolled beam. A spectrum analyzer applies a curve fit to the experimental data provided by input testing at points near a resonance and uses the half-power bandwidth method to determine the modal damping. For the low levels of vibration used in impact testing, the loss factor, n, for the first mode was n=0.001.

Figure 5:
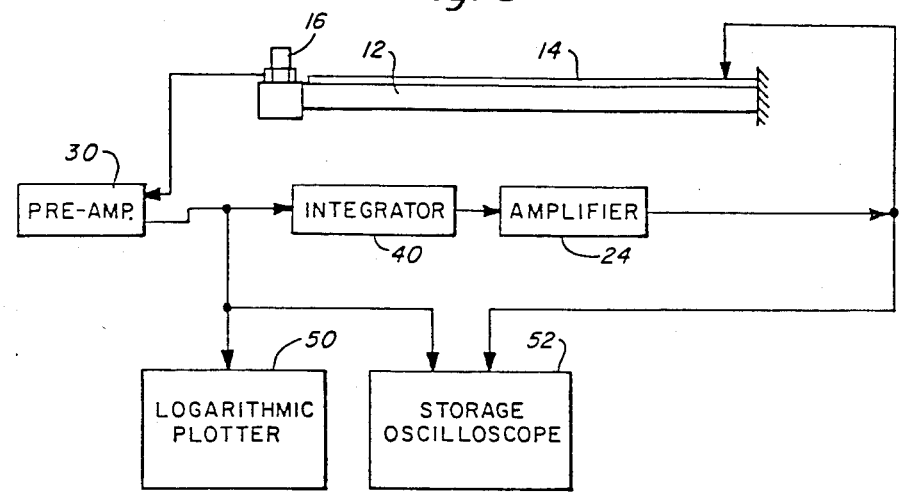
FIG. 5 is a schematic representation of the experimental model used in obtaining the data provided in Tables 1 and 2.

A schematic diagram of the equipment which may be used to implement the constant-gain and constant-amplitude controller function is shown in FIG. 5. The linear accelerometer signal from accelerometer 16 is amplified in pre-amplifier 30 and is integrated in integrator 40 to yield the tip velocity (V(t), which is amplified in amplifier 24 and applied to the PVF$_2$ film 14. A logarithmic plotter 50 is used to determine the damping via the log decrement method. The plotter 50 allows a determination of how the damping changes with amplitude of vibration, especially with the nonlinear feedback of the constant-amplitude controller function.

Experiments were conducted in which the tip of the beam was displaced 2 cm and released, and the decay or damping observed. By holding the tip of the beam and then releasing it, very little of the second and higher modes are introduced in the initial conditions. For the constant-gain controller function, the amplifier gain was set so that the maximum voltage amplitude would not exceed the voltage limit, V$_{max}$. The maximum gain allowed was determined experimentally since the maximum voltage occurred when the beam was first released. For the constant-amplitude controller function, the initial gain was determined in the same manner, but the gain was increased after the beam was released to keep the amplitude of the feedback voltage constant. This was done manually by turning the gain adjustment on the amplifier 24 while watching the feedback voltage on the oscilloscope 52. The gain was increased until the gain limit of the amplifier 24 was reached.

Figure 6:
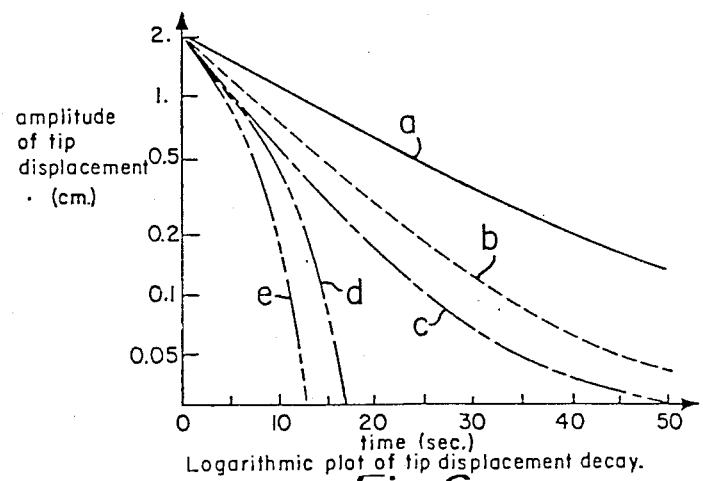
FIG. 6 is a logarithmic plot of beam tip displacement decay showing the amplitude of displacement in centimeters versus time in seconds for various parameters of control voltage applied to the piezoelectric film.

Two voltage limits were chosen, 100 and 200 VRMS. These limits were dictated by safety and control circuitry limitations, not by the breakdown voltage of the PVF$_2$ film which is over 1000 Volts. The results of these experiments are shown in FIG. 6 wherein five curves of tip displacement amplitude versus decay time a, b, c, d and e are plotted. Curve a represents an uncontrolled beam, curve b, a constant gain controlled damped beam with V$_{max}$=100 VRMS, curve c is the same as curve b except V$_{max}$=200 VRMS, curve d represents a constant amplitude controlled damped beam with V$_{max}$=100 VRMS, and curve e is the same as curve d with V$_{max}$=200 VRMS.

The typical decay of an uncontrolled beam, is shown in FIG. 6 curve a in a logarithmic plot. The slope of the curves of FIG. 6 represents the amount of damping or loss factor "n". On an oscillocope, the decay envelope of the displacement looks exponential, however, the logarithmic plot of curve a shows a slight change in the slope, whereas for a purely exponential (undamped) decay, the logarithmic plot should be a straight line. Thus, even without control, the loss factor, n, changes with amplitude. The loss factor at the large initial amplitudes ($\pm$2 cm tip displacement) is slightly more than n=0.003 decreasing to about n=0.001 for small amplitudes ($\pm$0.5 mm tip displacement). This confirms the damping value obtained for small amplitude vibrations from the impact testing previously referenced.

The results for a constant-gain controller function applied to the damping film for the two voltage limits are shown in FIG. 6 curves b and c. Since this is a linear controller function, one would expect the decay envelope to be exponential. As for the uncontrolled case, though, the slope of the logarithmic plots change slightly. This is probably due to the amplitude dependence of the loss factor in the beam itself. With V$_{max}$=100 VRMS, the average loss factor is slightly less than n=0.006, and slightly more than n=0.007 for V$_{max}$=200 VRMS. This is an improvement over the baseline curve (uncontrolled damping in the beam, curve a) but, as noted previously in the analysis, the feedback voltage drops as the vibrations decay indicating that better damping could be achieved at the small vibration amplitudes.

The results for a constant-amplitude controller voltage function are shown in FIG. 6 curves d and e which show a substantial improvement over any of the other curves. With V$_{max}$=100 VRMS (curve d), the vibrations are totally damped in 18 seconds. For V$_{max}$=200 VRMS, the vibrations are damped in 15 seconds (curve e). The decay envelopes are nearly linear, which is expected for a nonlinear control of constant amplitude. For both voltage limits the loss factor starts at the value achieved with the constant-gain controller function and steadily increases to at least n=0.040 for small amplitudes of vibration. This is at least a factor of 40 increase in the damping at small vibration levels. These results indicate that while an active damper of this type may not be optimum for large amplitudes of vibration, it should provide a method of keeping resonant vibration from building up since the highest level of damping is achieved for very small vibration levels. It may therefore be desirable to use this type of active damper in conjunction with another, more powerful actuator that will control the large amplitude vibrations. Powerful actuators often have problems such as limit-cycling or need a deadband at small vibration levels, providing a good complement to the active damper described here.

From the above, it is important to note that not only is it important to feed back the correct amplitude and phase signals to dampen the beam, the signals must be at the correct frequency to null the selected vibrational mode which in the test cases are the first order mode.

Figure 7:
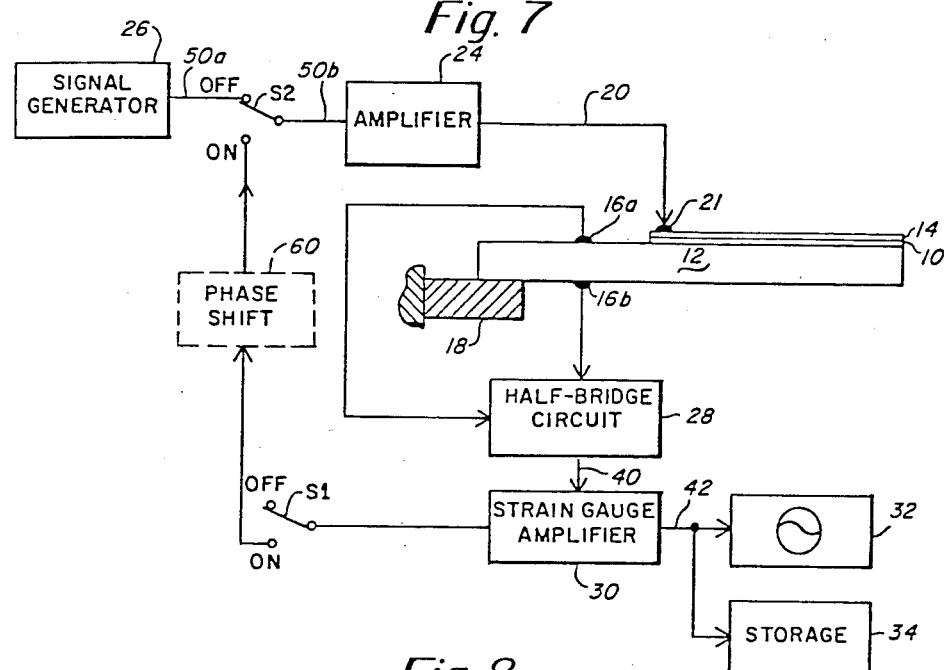
FIG. 7 is a schematic view of an active constrained layer damper embodiment of the invention in which a viscoelastic layer and a piezoelectric film material are used in combination to dampen vibrations in a cantilevered beam.

An alternate embodiment of of the invention is illustrated in FIG. 7. In this embodiment, a viscoelastic layer 10, such as one or more layers of damping tape, is applied to the surface of the member 12 in which vibrations are to be damped (e.g. a cantilevered beam). Piezoelectric film 14 is affixed to the exposed surface of the viscoelastic layer 10. A wire 20 is attached to the piezoelectric film 14 by a terminal 12a so that an oscillating voltage from signal generator 26 can be applied to the piezoelectric film 14. The voltage from signal generator 26 is coupled through wire 50a through the OFF position of switch S$_2$ and wire 50b to amplifier 24 where it is amplified and coupled to piezoelectric film 14 through wire 20. The voltage from signal generator 26 induces a strain in the piezoelectric film 14; this strain in turn induces distributed shearing displacement across the entire viscoelastic layer 10.

As in previous embodiments, the beam 12 may be bolted or otherwise secured to a fixed member 18. In an experimental application an aluminum beam with dimensions of 2.286$\times$10$^{-1}$ meters by 1.232$\times$10$^{-2}$ meters by 1.557$\times$10$^{-3}$ meters was affixed to beam 18 with a C-clamp (not shown). Two strain gauges 16a and 16b, one on each side of the beam 12, were mounted 2.54 centimeters away from the fixed end of the beam 12. The output terminals of the strain gauges 16a and 16b were coupled to a half bridge circuit 28 forming the input to strain gauge amplifier 30. Damping tape (3M #467, thickness 5.85$\times$10$^{-6}$ meters) was used for the viscoelastic layer 10.

The output of strain gauge amplifier 30 is coupled via lead 42 to an oscilloscope 32 for immediate viewing and via lead 44 to a data storage device such as a magnetic tape or disc for storage. Also the output of amplifier 30 may be coupled through switch S$_1$ to the ON terminal of switch S$_2$. When S$_1$ and S$_2$ are in the ON position, the amplified strain gauge signal is fed back to amplifier 24 and used to dampen vibration signals induced when beam 12 is deflected and allowed to dampen out. Alternatively, when S$_1$ and S$_2$ are in the OFF position, the voltage from signal generator 26 is coupled to amplifier 24 and applied to film 14 to induce deflection of the beam 12.

A series of experiments were conducted to test the efficacy of the piezoelectric film 14 as an active constrained damping layer.

The first set of experiments merely applied voltage from signal generator 26 without the use of feedback from the strain gauges 16a and 16b attached to the beam 12. The oscilloscope 32 was set at 4 volts peak to peak with a sweep time of two seconds for the screen. The strain gauge amplification factor was set at 2000 and the half bridge excitation voltage was 6 volts D.C.

The first test was designed to determine the natural frequency and logarithmic decrement of the beam 12 per se. A manual deflection of 0.3 centimeters at the tip of the beam 12 registered a 2 volt output on the oscilloscope 32. With the strain gauge bridge circuit balanced, the beam 12 was manually pushed down 0.3 centimeters and released. The first sweep of the oscilloscope 32 under 4 volts peak to peak was stored in data storage device 34 and the data analyzed. The first peak measured was the first peak under two volts. The logarithmic decrement was determined from the first and thirtieth peaks. All tests were repeated four times and the data averaged. The time between peaks was measured so that the natural frequency could be determined.

Next, two layers of viscoelastic layer 10 were applied to the beam 12, and the same tests repeated.

A bimorph piezoelectric film 14 (see FIG. 7a) was then placed on the viscoelastic layer complete with terminals and connections as shown in FIG. 7. A bimorph is two sheets of piezoelectric film joined together along the positive edges. Logarithmic decrement and natural frequency tests were then performed. Voltage was then applied to the bimorph 14 from the signal generator 26. Logarithmic decrements were measured with the voltage varying from 6 Hertz to 6000 Hertz and from 0 to 270 volts A.C. Four runs were made at each given signal.

Figure 8:
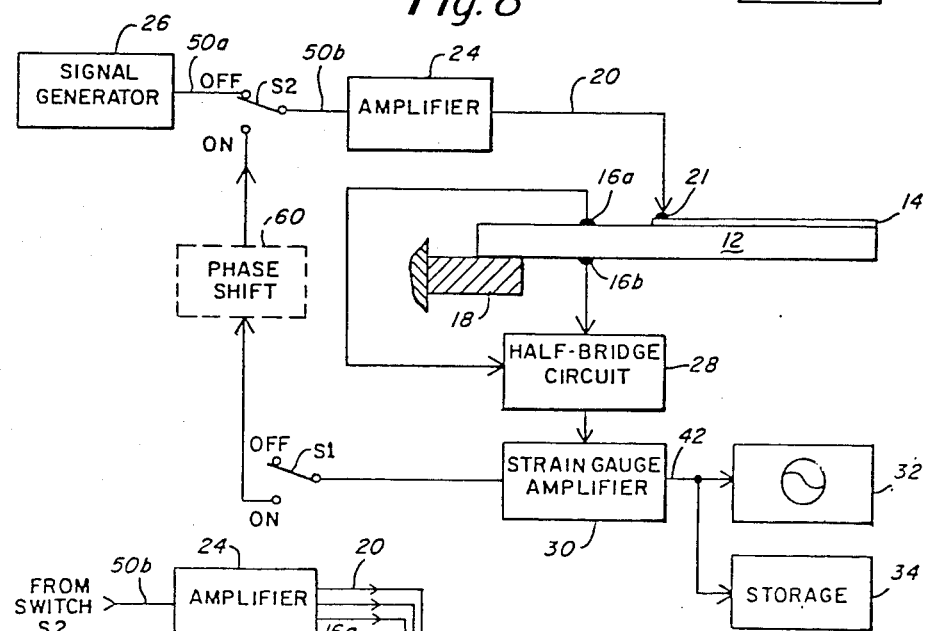
FIG. 8 is an alternate embodiment of the invention in schematic form showing an active damper or free damping layer embodiment of the invention in which a feedback loop is used to feed voltage from a strain gauge amplifier to the piezoelectric film material to dampen vibration in the member.
Figure 9:
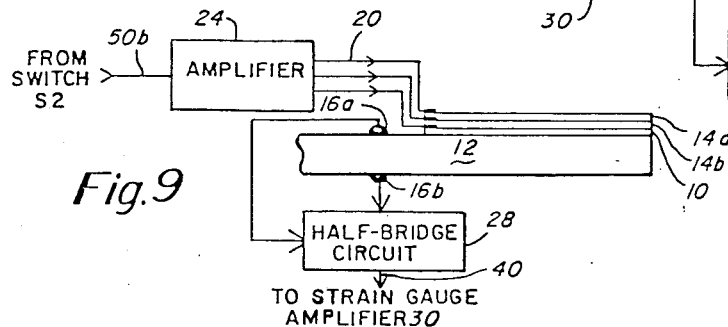

Next, the bimorph was removed and a single layer of piezoelectric film 14 as shown in FIG. 8 with wire terminals was applied to the exposed surface of the viscoelastic layer 10. All tests were then repeated. The results of the tests using the piezoelectric film and varying voltages are shown in Table 3. The results are somewhat inconsistent, in that the logarithmic decrement increased or decreased plus or minus 5 percent, depending on the voltage applied to the piezoelectric film. The results do demonstrate that by proper selection of feedback voltage to the film damping via intermediate viscoelastic layer is possible as shown by the experiments below.

An active constrained damper layer may be implemented by placing switches $S_1$ and $S_2$ in the ON positions by-passing generator 26 and feeding back signals from strain gauges 16a and 16b. A series of experiments were conducted to test the efficacy of such a system in which the piezoelectric film acts as an active constrained damper layer in such a feedback system. Voltage from the strain gauges 16a and 16b were amplified in amplifier 30 and fed back to amplifier 24. Tests were run with a single sheet of piezoelectric film 14 (as in FIG. 8) applied to the exposed surface of the viscoelastic layer 10. Voltage applied across the piezoelectric film was varied from 0 to 270 volts and the logarithmic decrement was measured.

Next, a phase shift circuit 60 (shown in phantom in FIG. 8) was added to the feedback loop. The phase circuit was set so that at the natural frequency of the beam 12, a leading phase shift of 90 degrees was attained.

The results of these tests are shown in Table 4. The logarithmic decay measured under a given set of conditions did not vary more than 3 percent from the group mean. A ±13 percent change in damping was obtained.

In another experiment, similar to that described in connection with FIG. 5, the piezoelectric film 14 was used directly to dampen vibrations; i.e. a free layer embodiment in which no viscoelastic layer 10 was used (as in FIG. 2). In this embodiment, as shown in FIG. 8, voltage was applied to the piezoelectric film 14 which acted directly to dampen the vibration in the beam. Eastman 910 permabond glue was used to apply the piezoelectric film 14 to the beam 12.

A series of experiments were conducted to test the efficacy of the piezoelectric film 14 as a free active damper. These tests were the same as those described above for the active constrained damping layer, except that no viscoelastic layer 10 was used, are shown in Table 3. The data were consistent and show that a ±13 percent change in damping was produced when the velocity of the beam was fed back to the film. The magnitude of the damping increase was greater under these conditions than in the tests in which a piezoelectric film was used in a constrained layer damper configuration.

EQUIVALENTS

Those skilled in the art will recognize, or be able to ascertain employing no more than routine experimentation, many equivalents to the specific components, steps and materials described specifically herein, and such equivalents are intended to be encompassed within the scope of the following claims.

TABLE 1

| Beam Properties | | |
|---|---|---|
| | Test Structure | Beam |
| Material | Aluminum | Steel |
| Modulus, E ($Nm^2$) | $76 \times 10^9$ | $210 \times 10^9$ |
| length, L (m) | 1.22 | 0.146 |
| thickness, h (mm) | 3.18 | 0.381 |
| width, b (cm) | 15.2 | 1.27 |
| tip mass, $M_t$ (kg) | 2.04 | $6.73 \times 10^{-3}$ |
| tip inertia, $I_t$ ($kgm^2$) | $1.1 \times 10^{-2}$ | $5.0 \times 10^{-7}$ |
| density, p ($kgm^{-3}$) | 2840 | 7800 |

TABLE 2

| $PVF_2$ Properties | |
|---|---|
| Modulus, E ($Nm^2$) | $2.0 \times 10^9$ |
| Static piezoelectric constant, $d_{31}$ ($MV^{-1}$) | $22 \times 10^{-12}$ |
| length, L (m) | 0.146 |
| thickness, h (mm) | $28 \times 10^{-3}$ |
| width, b (cm) | 1.27 |
| density, p ($kgm^{-3}$) | 1800 |
| breakdown voltage, (V) | 1400+ |

TABLE 3

Logarithmic Decrement of Beam with Voltage Applied Across The Piezoelectric Film from a Signal Generaror

| Peak Voltage (Volts) | Frequency (Hz) | Logarithmic Decrement[1] | |
|---|---|---|---|
| | | Bimorph | Single Sheet |
| 0 | — | .0498 | .0190 |
| 75 | 6 | .0494 | .0189 |
| 93 | 9 | .0498 | .0191 |
| 129 | 15 | .0497 | .0191 |
| 140 | 17 | .0491 | .0188 |
| 153 | 20 | .0496 | .0189 |
| 100 | 21 | .0495 | .0189 |
| 200 | 21 | .0498 | .0187 |
| 270 | 30 | .0495 | .0190 |
| 160 | 50 | .0497 | .0190 |
| 140 | 60 | .0494 | .0190 |
| 100 | 100 | .0499 | .0192 |
| 100 | 200 | .0497 | .0189 |
| 100 | 300 | .0503 | .0188 |
| 100 | 400 | .0494 | .0190 |
| 100 | 600 | .0498 | .0193 |
| 100 | 1000 | .0497 | .0191 |
| 100 | 2000 | .0502 | .0187 |
| 100 | 4000 | .0498 | .0192 |
| 100 | 6000 | .0497 | .0190 |

[1]Value represents the average of 4 tests

TABLE 4

Logarithmic Decrement of Beam with Two Layers of Viscoelastic Material and a Single Sheet of Piezoelectric Film. Beam Position is Fed back to the Film with Varying Voltages and Phase Shifts

|  | Peak Voltage (Volts) | Phase Shift (Degrees) | Logarithmic Decrement Average[1] |
|---|---|---|---|
|  | 0 | — | .0190 |
|  | 148 | 180 | .0194 |
|  | 200 | 180 | .0195 |
|  | 270 | 180 | .0196 |
| Full Feedback[2] | 270 | 180 | .0203 |
| Full Feedback | 270 | 0 | .0177 |
| Full Feedback | 270 | 90 | .0164 |
| Full Feedback | 270 | 270 | .0216 |

[1]Value represents the average of 4 tests
[2]Full Feedback refers to the fact that the amplifier is clipping and the peak voltage of 270 volts remains even when the beam's displacement decays.

TABLE 5

Logarithmic Decrement of Beam with A Single Sheet of Piezoelectric Film Used as an Active Damper. Beam Position is Fed Back with Varying Phase Shifts.

|  | Peak Voltage (Volts) | Phase Shift Degrees) | Logarithmic Decrement | | | | Average |
|---|---|---|---|---|---|---|---|
|  |  |  | 1 | 2 | 3 | 4 |  |
| Full Feedback[1] | 270 | 180 | .0325 | .0323 | .0326 | .0326 | .0325 |
|  | 270 | 0 | .0282 | .0280 | .0290 | .0283 | .0284 |
|  | 270 | 90 | .0268 | .0270 | .0259 | .0264 | .0265 |
|  | 270 | 270 | .0340 | .0347 | .0348 | .0346 | .0345 |
|  | 0 | — | .0306 | .0310 | .0300 | .0303 | .0305 |

[1]Full feedback refers to the fact that the amplifier is clipping and the peak voltage of 270 volts is maintained even when the beam's displacement decays.

What is claimed is:

1. An apparatus for damping vibrations in a member, comprising:
   a. transducer means for sensing mechanical vibrations in said member and producing a first electrical signal proportional thereto;
   b. a piezoelectric film material constituting a distributed parameter controller mechanically cooperating with the member;
   c. means responsive to said first electrical signal for applying a second electrical signal to the film material of the proper phase and amplitude to induce a mechanical strain in the film material to dampen vibrations in said member.

2. A method of damping vibrations in a member, comprising the steps of:
   a. forming a distributed parameter film means of piezoelectric material for damping vibration in said member in cooperative relationship with a principal surface of said member and;
   b. sensing vibrations in said member and producing with said film means a first electrical signal proportional to said sensed vibration;
   c. applying to said film means a second electrical signal derived from said first signal of proper amplitude and phase to dampen said vibrations in said member.

3. A method of claim 2 in which the piezoelectric film means is formed of polyvinylidene fluoride.

4. A method of damping mechanical vibrations of a plurality of modes in a mechanical member, comprising the steps of:
   a. forming a non-spatially discrete piezoelectric film means for damping vibrations in a large number of vibrational modes in cooperative relationship with the surface of the member in which vibrations are to be damped;
   b. attaching strain detection means to said member for detecting mechanical modes of vibration and converting said mechanical modes to an electrical vibration signal proportional to said modes of vibration;
   c. amplifying the vibration signal; and
   d. coupling to the piezoelectric film means a proportional signal which is proportional to the amplified vibration signal.

5. A method of claim 4 in which the piezoelectric film means is comprised of a layer of polyvinylidene fluoride.

6. A method of claim 5 which the proportional signal is shifted in phase prior to being coupled to the film means.

7. A method of claim 6 in which the piezoelectric film means is polyvinylidene fluoride.

8. Apparatus for damping vibrations in a mechanical member, comprising:
   a. a distributed parameter film means of piezoelectric material mechanically cooperating with said member such that as an electrical signal is applied to the film means, corresponding mechanical strain signals are induced in the member;
   b. transducer means cooperating with said member to sense vibrations in said member and to generate said electrical signal from said sensed vibrations.

9. The apparatus of claim 8 in which the piezoelectric material is polyvinylidene fluoride.

10. The apparatus of claim 8 in which a feedback loop is provided intermediate the film means and transducer means which includes a phase shift circuit for changing the phase of the electrical signal.

11. An apparatus of claim 10 in which the rate of change of the mechanical member vibration is coupled back to the piezoelectric film means by taking the derivative of the vibrational displacement detected by the transducer means.

12. An apparatus for damping vibrations in a mechanical system, comprising:
   a distributed parameter film means of piezoelectric material for damping vibration in said system, mechanically cooperating with a member such that, in response to an electrical signal applied to the film means, corresponding mechanical strain signals are induced in the member to dampen said vibrations.

13. A method of damping vibrations in a mechanical member, comprising the steps of:
   a. applying a distributed parameter film means of piezoelectric material for damping vibrations in the mechanical member in cooperative relationship with the surface of the member in which vibrations are to be damped;
   b. attaching accelerometer means to said member for providing an acceleration signal proportional to the linear or angular acceleration of said member;
   c. integrating said acceleration signal to provide a member velocity signal;
   d. feeding back to the film means a negative feedback signal derived from said velocity signal to dampen vibrations in said member.

14. A method of claim 13 in which the negative feedback signal is a constant gain signal.

15. A method of claim 13 in which the negative feedback signal is a constant amplitude signal.

16. A method of claim 13 in which the negative feedback signal is a non-linear signal.

17. The method of claim 13 in which the feedback signal is:

$$sgn\left(\left.\frac{\partial^2 w}{\partial t \partial x}\right|_L\right) \cdot V_{max}$$

-continued wherein $\left.\frac{\partial^2 w}{\partial t \partial x}\right|_L$ = angular velocity at an extremity of the member.

18. The method of claim 13 in which the feedback signal is:

$$K \cdot \left(\left.\frac{\partial w}{\partial t}\right|_L\right)$$

and $V(t) \leq V_{max}$ wherein K is a constant equal to feedback gain.

* * * * *